US012576603B2

(12) United States Patent
Aiello et al.

(10) Patent No.: US 12,576,603 B2
(45) Date of Patent: Mar. 17, 2026

(54) MONITORING CABLE INTEGRITY DURING PIPELINE MANUFACTURE

(71) Applicant: Acergy France SAS, Suresnes (FR)

(72) Inventors: Giovanni Aiello, Salins (FR); Guy Mencarelli, Paris (FR)

(73) Assignee: ACERGY FRANCE SAS, Suresnes (FR)

( * ) Notice: Subject to any disclaimer, the term of this patent is extended or adjusted under 35 U.S.C. 154(b) by 522 days.

(21) Appl. No.: 18/017,848

(22) PCT Filed: Jul. 24, 2021

(86) PCT No.: PCT/IB2021/000525
§ 371 (c)(1),
(2) Date: Jan. 24, 2023

(87) PCT Pub. No.: WO2022/018520
PCT Pub. Date: Jan. 27, 2022

(65) Prior Publication Data
US 2023/0302751 A1 Sep. 28, 2023

(30) Foreign Application Priority Data

Jul. 24, 2020 (GB) ..................................... 2011547

(51) Int. Cl.
*B29D 23/00* (2006.01)
*B29C 53/58* (2006.01)
(Continued)

(52) U.S. Cl.
CPC ............ *B29D 23/005* (2013.01); *B29C 53/58* (2013.01); *B29C 53/582* (2013.01); *B29D 23/00* (2013.01);
(Continued)

(58) Field of Classification Search
CPC .... B29D 23/00; B29D 23/005; B29D 23/001; B29C 53/58; B29C 53/582; F16L 9/18; G01R 31/08; G01R 31/59; G01R 31/081
See application file for complete search history.

(56) References Cited

U.S. PATENT DOCUMENTS 3,349,324 A * 10/1967 Wakefield .............. G01R 31/59
324/514
3,564,526 A * 2/1971 Butts .................... G01M 3/045
200/61.04
(Continued)

FOREIGN PATENT DOCUMENTS

CN 1071259 4/1993
DE 102012218067 4/2014
(Continued)

OTHER PUBLICATIONS

International Search Report of PCT/IB2021/000525 dated Dec. 2, 2021.

*Primary Examiner* — Helen C Kwok
(74) *Attorney, Agent, or Firm* — MATTINGLY & MALUR, PC

(57) ABSTRACT

When manufacturing a pipeline that carries an array of electrical cables, insulation resistance monitoring is performed by a monitoring unit that is connected to the cables of the array and is mounted to a leading end of the pipeline. The monitoring unit tests the cables cyclically in succession. Monitoring is performed on the cables after their application to the pipeline and while the pipeline and the cables advance together through further manufacturing processes, such as insertion of the pipeline into the outer pipe of a pipe-in-pipe structure. If a fault is detected in any of the cables, an alert can be raised quickly enough to stop the process and to rectify the fault before the fault is covered and rendered
(Continued)

Figure 1:
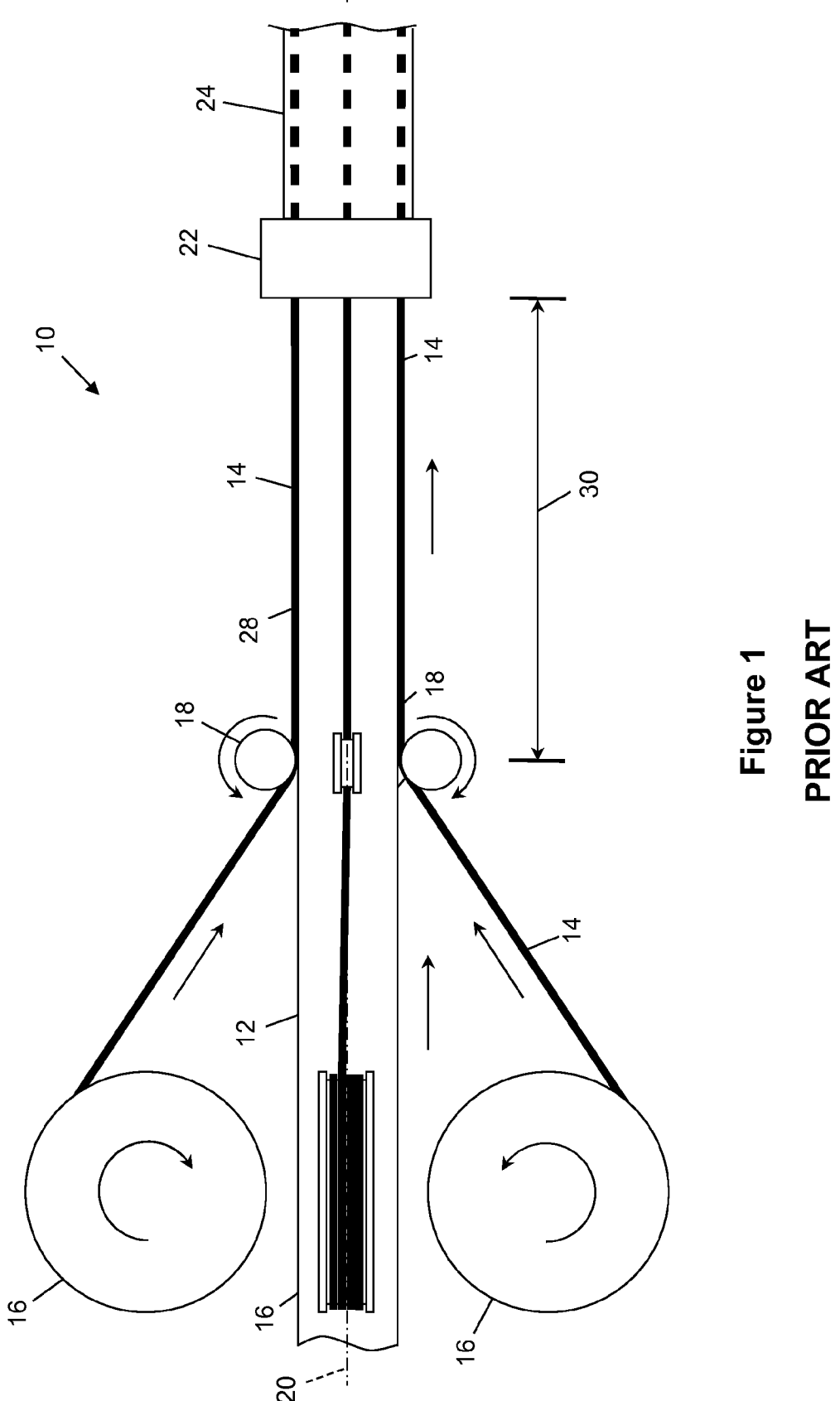

inaccessible. The pipeline and the cables can advance continuously unless a fault is detected.

28 Claims, 5 Drawing Sheets

(51) Int. Cl.
  *F16L 9/18*     (2006.01)
  *G01R 31/08*    (2020.01)
(52) U.S. Cl.
  CPC .............. *B29D 23/001* (2013.01); *F16L 9/18* (2013.01); *G01R 31/081* (2013.01)

(56)      References Cited

U.S. PATENT DOCUMENTS

| | | | | |
|---|---|---|---|---|
| 3,588,689 A * | 6/1971 | Crawford | ............... | G01R 31/08 |
| | | | | 324/519 |
| 3,981,181 A * | 9/1976 | Ochiai | ................... | G01M 3/165 |
| | | | | 174/11 R |
| 4,684,293 A * | 8/1987 | Takafuji | ................... | H01B 7/32 |
| | | | | 324/700 |
| 4,826,091 A * | 5/1989 | Legatos | ................... | E04G 21/12 |
| | | | | 242/431 |
| 5,279,148 A * | 1/1994 | Brandes | ................... | G01M 3/18 |
| | | | | 73/40.5 R |
| 6,262,578 B1 * | 7/2001 | Hudson | .............. | G01R 31/1263 |
| | | | | 324/522 |
| 6,566,887 B2 * | 5/2003 | Smith | .................... | G01R 31/58 |
| | | | | 324/544 |
| 8,575,945 B2 | 11/2013 | Douglas | | |
| 8,756,788 B2 | 6/2014 | Espinasse et al. | | |
| 9,823,288 B2 | 11/2017 | Boer | | |
| 10,443,763 B2 | 10/2019 | Green et al. | | |
| 11,241,820 B2 | 2/2022 | Pionetti et al. | | |
| 2001/0052778 A1 * | 12/2001 | Smith | ................ | G01R 31/1272 |
| | | | | 324/541 |
| 2001/0054902 A1 * | 12/2001 | Smith | .................... | G01R 31/58 |
| | | | | 324/544 |
| 2010/0008371 A1 * | 1/2010 | Brekke | ................... | H04L 45/00 |
| | | | | 340/850 |
| 2011/0298467 A1 * | 12/2011 | Douglas | .............. | E21B 41/0007 |
| | | | | 324/509 |
| 2016/0273994 A1 * | 9/2016 | McNab | ................... | G01M 3/18 |
| 2016/0348808 A1 * | 12/2016 | Green | ....................... | F17D 1/05 |
| 2018/0023731 A1 | 1/2018 | Varkey et al. | | |

FOREIGN PATENT DOCUMENTS

| | | |
|---|---|---|
| GB | 2476152 | 6/2011 |
| JP | S59154372 | 9/1984 |
| WO | WO 2011/007083 | 1/2011 |
| WO | WO 2016/085480 | 6/2016 |
| WO | WO 2018/091814 | 5/2018 |

* cited by examiner

MONITORING CABLE INTEGRITY DURING PIPELINE MANUFACTURE

This invention relates to the manufacture of pipelines and particularly to the problems of monitoring the integrity of wires or cables during or after their installation along, or incorporation into, a pipeline. The invention relates especially to the challenges of monitoring cable integrity quickly enough to allow defects to be corrected before the cable becomes more difficult to access after subsequent processing or assembly steps.

In this specification, references to pipelines include pipe stalks that are fabricated from a succession of pipe joints and that are then welded together, in turn, to form longer pipelines. For example, pipe stalks of up to a few kilometres in length may be manufactured at a coastal spoolbase in support of reel-lay operations in the subsea oil and gas industry.

Pipelines may, for example, be used underwater as 'tiebacks' to transport crude oil and/or natural gas from a subsea wellhead across the seabed on the way to the surface, typically via a riser. Specifically, on production of hydrocarbons from a subsea well, the produced fluid emerges from the wellhead at high temperature and pressure and then enters a subsea pipeline. During subsequent transportation along the pipeline, the temperature and pressure of the produced fluid have to be kept high enough to ensure a sufficient flow rate across the seabed and up the riser. Thus, various measures are taken to ensure that the internal temperature of the pipeline remains high despite thermal exchange with the much colder surrounding seawater.

Designers of subsea pipelines have adopted both passive and active approaches to thermal management, either individually or in combination. In passive thermal management systems, the pipeline is thermally insulated to retain heat in fluids carried by the pipeline. Conversely, active thermal management systems add heat to the pipeline.

Pipe-in-pipe (PiP) structures are used as pipelines in the subsea oil and gas industry. A PiP structure is an example of passive thermal management, comprising a fluid-carrying inner pipe positioned concentrically within an outer pipe. The inner and outer pipes are spaced from each other to define a thermally insulating annulus between them. Typically, thermally insulating material is disposed in the annulus; it is also possible to draw down a partial vacuum in the annulus or to inject an insulating gas to reduce transmission of heat through the annulus.

As an example of active thermal management, a trace heating system typically employs resistive electrical cables running along, and in thermal contact with, the outer surface of a steel pipeline. The cables may extend in straight lines parallel to the central longitudinal axis of the pipeline, in a helix spiralling around the longitudinal axis, or in wavy pattern that extends both circumferentially and longitudinally. Heat produced by passing an electric current along the cables is conducted through the pipe wall to the production fluid flowing within.

Electrically trace-heated pipe-in-pipe employs a combination of passive and active thermal management to manage the temperature of production fluids optimally. In particular, resistive electrical cables are disposed within the annulus between the inner and outer pipes, in thermal contact with the inner pipe. Typically, the cables are buried beneath, or radially within, layers or blankets of thermal insulation material also disposed in the annulus and pass through or beneath structures such as bulkheads, anodes or spacers that extend radially across the annulus. While trace-heated pipeline is common in onshore applications, it has been used more rarely offshore because of exposure to seawater: the insertion of trace-heating cables in a PiP structure for offshore application is recent technology.

Cables may also be installed along a pipeline to carry data for communication, control or monitoring purposes, or to convey electrical power along the pipeline.

Figure 2:
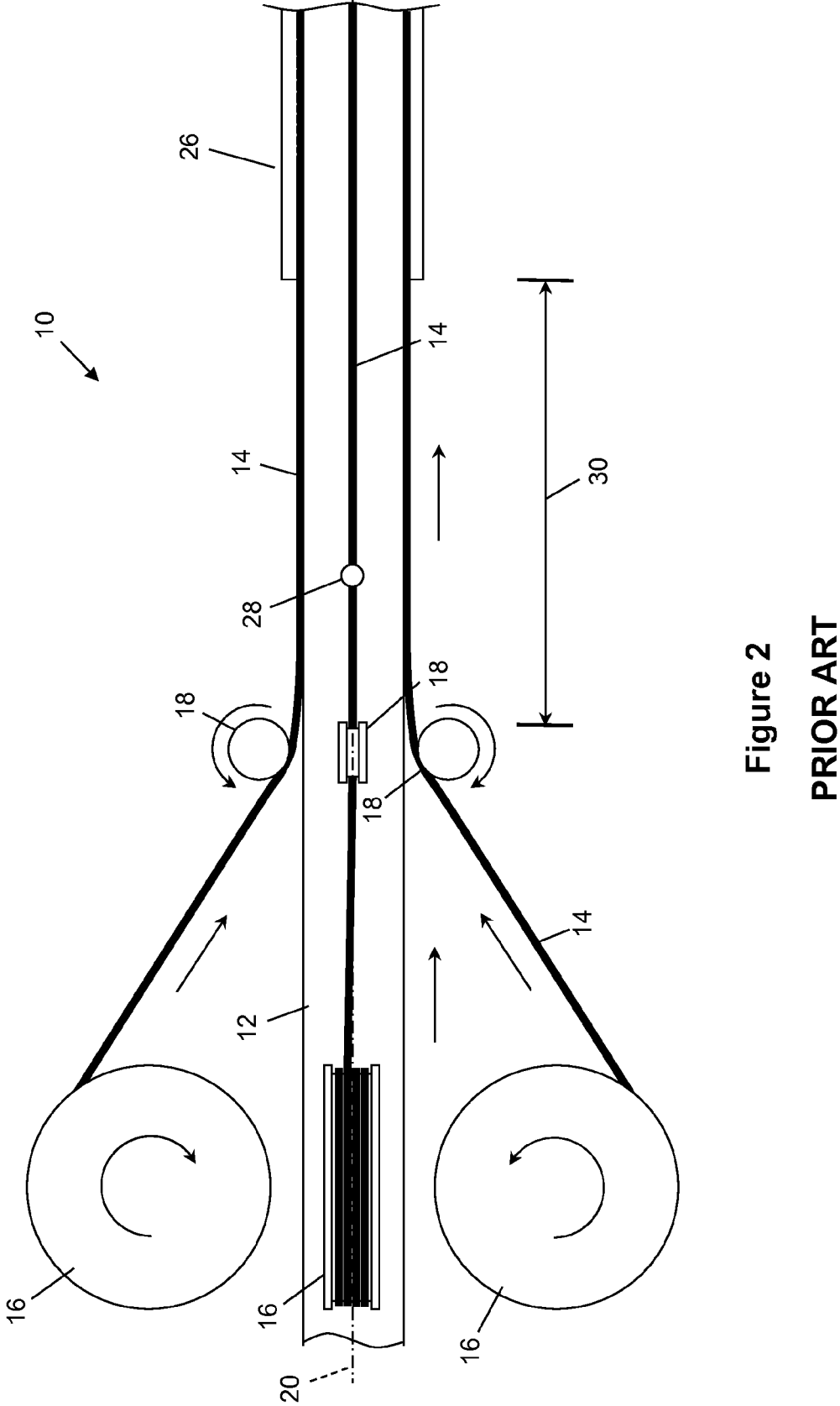

FIGS. 1 and 2, in which like numerals are used for like features, show part of a pipeline manufacturing facility 10, such as a coastal spoolbase, in which a pipeline 12 advances from left to right as shown. The pipeline 12 is typically fabricated by welding together a succession of steel pipe joints at an upstream location within the facility 10, not shown. When the pipeline 12 reaches the stage of manufacture shown in FIGS. 1 and 2, heating cables 14 are unspooled from respective reels 16 and guided by respective guides 18 onto the outer surface of the pipeline 12. There, the cables 14 are then fixed in place by circumferential straps or other conventional fixings, not shown.

In this simplified example, the cables 14 are equi-angularly spaced about the central longitudinal axis 20 of the pipeline 12 and extend parallel to that axis 20 and to each other. As noted above, however, the cables 14 could follow helical or wavy paths instead. Whilst the cables 14 are shown here parallel to the axis 20 for simplicity of illustration, a helical path is sometimes preferred because it allows the cables 14 to be tensioned between the guides 18 and the pipeline 12 by holding the cables 14 around the pipeline 12 by friction. Additionally, helically-wound cables 14 withstand bending of the pipeline 12 more readily during the installation on the seabed.

Also for simplicity of illustration, only four cables 14 are shown here, one of which is hidden behind the pipeline 12, but in practice there can be several more cables 14 so that the angular spacing between neighbouring cables 14 is substantially less than that shown. For example, there may be thirty to thirty-six cables 14 distributed around the pipeline 12. The more numerous and closer together the cables 14, the lower their operating voltage.

Downstream of the location where the cables 14 are brought into contact with or applied to the pipeline 12, which location is defined by the location of the guides 18 in this example, the cables 14 are covered over or concealed, and hence become inaccessible, where the pipeline 12 undergoes at least one further process. In FIG. 1, that further process is represented by a work station 22, at which a coating 24 is extruded over the pipeline 12 and the cables 14. In FIG. 2, that further process is represented by the pipeline 12, here serving as the inner pipe of a PiP assembly, being inserted telescopically into the outer pipe 26 of the PiP assembly. The outer pipe 26 may, for example, be more than 1.5 km long as part of a pipe stalk that will form part of a reel-laid pipeline.

In FIG. 2 and other drawings, motion is shown schematically in one direction. However, at least part of the cable-laying apparatus could move back and forth longitudinally.

Extrusion of the coating 24 is merely one example of a further process that may be performed at the work station 22 with the consequence of covering the cables 14. Correspondingly, the coating 24 is merely one example of a covering that may conceal the cables 14. Other examples of such further processes and coverings are the addition of thermal insulation material, bulkheads or spacers as noted above.

There could be a succession of such further processes at a succession of work stations 22 spaced along the advancing pipeline 12, such as adding spacers at a first work station 22 and then adding insulation material between the spacers at a second work station 22 downstream of the first work station 22.

As noted above, the act of inserting the pipeline 12 into the outer pipe 26 as shown in FIG. 2 may be regarded as a further process that conceals the cables 14. Similarly, therefore, the outer pipe 26 may also be regarded as a covering that conceals the cables 14. Additionally, intermediate processes performed at one or more work stations 22 may apply another covering such as thermal insulation material, bulkheads or spacers over the cables 14 before that part of the pipeline 12 enters the outer pipe 26.

The process of installing the cables 14 along the pipeline 12 imparts strain in the cables 14 and so could introduce or exacerbate defects or faults as the cables 14 are bent along their length or stretched longitudinally before being fixed to the pipeline 12. Consequently, it is necessary to detect faults in the cables 14 after lengths of the cables 14 have been fixed to the pipeline 12. One such fault 28 is shown schematically in one of the cables 14 in FIGS. 1 and 2.

In view of industrialisation constraints and factory organisation, it is advantageous to detect faults 28 as soon as possible after the cables 14 have been installed on the pipeline 12. As noted above, additional covering items such as a coating 24, spacers or insulation material may be installed around the pipeline 12 and over the cables 14 as shown in FIG. 1. It is important that any fault 28 in the cables 14 should be detected before any such items cover and hence obscure the cables 14, or as soon as possible after the installation of such items in case they pinch the cables 14. This constraint is all the more important when manufacturing a PiP arrangement as shown in FIG. 2, where the pipeline 12 that carries the cables 14 is inserted into an outer pipe 26 and consequently the outer pipe 26 then renders inaccessible the parts of the cables 14 within.

In practice, therefore, the opportunity to detect and easily rectify a fault 28 is restricted to when the fault 28 is in a measurement or inspection zone 30 defined between the upstream location where the cables 14 are first applied to the pipeline 12 and the downstream location where significant lengths of the cables 14 are first covered over or concealed. In the examples of FIGS. 1 and 2, the upstream end of the inspection zone 30 corresponds to the longitudinal position of the guides 16. In FIG. 1, the downstream end of the inspection zone 30 is represented by the work station 22 whereas in FIG. 2, the downstream end of the inspection zone 30 is represented by the facing end of the outer pipe 26.

The process of manufacturing a trace-heated pipeline 12 as shown in FIGS. 1 and 2 is a discontinuous, step-wise process. Specifically, the pipeline 12 is held stationary throughout a test period during which the lengths of the cables 14 applied to the pipeline 12 upstream of the work station 22 or the outer pipe 26 are tested and inspected one-by-one for integrity. When all of the cables 14 have been tested and passed, the pipeline 12 is advanced to bring the tested lengths of the cables 14 through the work station 22, as in FIG. 1, or into the outer pipe 26, as in FIG. 2. During this movement of the pipeline 12, fresh lengths of the cables 14 are drawn from the reels 16 and applied to the pipeline 12 before the pipeline 12 is stopped again to allow further testing of the cables 14. Testing may therefore lie on the critical path and so could delay the process of manufacturing the pipeline 12.

Failing to detect a fault 28 while the fault 28 is still in the inspection zone 30 is likely to result in the fault 28 becoming inaccessible under subsequently-installed items such as a coating 24, spacers or insulation material as shown in FIG.

1. Such coverings would then have to be removed to find, access and rectify the fault 28, possibly causing damage and requiring lengthy remedial work. All such operations involved in tracing and rectifying faults and subsequent remediation lie on the critical path and therefore will delay the production process.

Worse, in a PiP arrangement like that shown in FIG. 2, faulty cables 14 fixed to the pipeline 12 may be inserted into the outer pipe 26 such that accessing the location of a fault 28 is only possible by reversing the assembly process to withdraw the pipeline 12 from the outer pipe 26. Pulling back the pipeline 12 in this way causes serious delays and could further damage the cables 14. Consequently, as soon as the pipeline 12 has been pushed into the outer pipe 26 to the extent that an undetected fault 28 in a cable 14 enters the outer pipe 26, the fault 28 becomes very difficult to correct.

WO 2018/091814 describes a machine for depositing multiple cables simultaneously onto the external surface of a pipe in a manner akin to that shown schematically in FIG. 1, albeit in a helical arrangement. However, that document does not consider monitoring of the cables.

WO 2011/007083 describes another machine for depositing multiple cables simultaneously onto the external surface of the inner pipe of a PiP assembly in a manner akin to that shown schematically in FIG. 2, but again in a helical arrangement. The process is discontinuous; the cable winding machine is on a trolley that moves forwards and backwards.

Again, WO 2011/007083 does not consider monitoring of the cables. However, as only three high-voltage cables are installed in that case, the speed of monitoring or testing the cables is not as critical as in the circumstances addressed by the invention. In this respect, monitoring a few high-voltage cables as in WO 2011/007083 is much less of a challenge than monitoring many low-voltage cables as in the present invention. In this respect, detection of faults is easier and quicker at high voltage whereas lower voltage makes quick detection of faults more challenging, as does a much greater number of cables to monitor together.

It is known in the art to check the integrity of cables by using insulation resistance monitoring devices, as described in, for example, JP S59154372. Several such devices are available, for example from C-Kore Systems Ltd in the UK. GB 2476152 also describes an example of a resistance monitoring device. However, such devices are designed to be used on static cables, require a significant period of time to detect a fault and do not make it easy quickly to identify the location of the fault on the cable. Also, insulation resistance monitoring typically involves applying a DC voltage of between 500V and 2500V to the cable. The higher the voltage, the faster faults can be detected but such high voltages may be dangerous for workers near the cables and could even damage insulation on the cables, hence potentially causing a fault. An alternative monitoring method involving time domain reflectometry is not suitable.

CN 1071259 describes how an insulation resistance testing method can be applied to a buried pipeline to detect defects in an anti-corrosion coating of the pipeline. However, its teaching is of no use for monitoring the integrity of electrical trace heating cables.

DE 102012218067 discloses another method of monitoring a group of cables, in this case in the tower of a wind turbine, which involves monitoring temperature differences between the cables. Such a method is suitable for use only when the cables are in service, hence after installation but not during the manufacturing phase.

US 2018/023731 describes a multi-layer coiled tube with electrical and fibre optic components. The multi-layer tube may include an inner coiled tube, surrounded circumferentially and longitudinally by an outer tube. Conductors in the form of electrical and fibre optic cables may be positioned between the inner coiled tube and the outer tube.

WO 2016/085480 describes a pipeline, or a segment thereof, in which communication cables, such as fibre optic cables are provided. This enables the transfer of data without requiring separate fibre optic cables to be laid in addition to the pipeline.

It is against this background that the present invention has been devised. In one sense, the invention resides in a method of manufacturing a pipeline having at least one cable applied thereto. The method comprises: performing insulation resistance monitoring on the at least one cable during application of the at least one cable to the pipeline while the at least one cable is moving relative to the pipeline; and raising an alert if the insulation resistance monitoring detects a fault in the at least one cable applied to the pipeline.

Relative movement between the at least one cable and the pipeline may be stopped upon raising the alert. Similarly, when advancing the pipeline or a cable lay apparatus while applying the at least one cable to the pipeline and performing insulation resistance monitoring on the at least one cable, the advance of the pipeline or of the cable lay apparatus may be stopped upon raising the alert.

When performing a process that covers the pipeline and the at least one cable applied to the pipeline, the advance of the pipeline may be stopped before the fault in the at least one cable is covered by said process. Said process may, for example, be either insertion of the pipeline and the at least one cable into an outer pipe or application of a covering over the pipeline and the at least one cable.

The pipeline may be advanced through an inspection zone in which the at least one cable applied to the pipeline is accessible, before the pipeline and the at least one cable applied to the pipeline are covered by said process. The fault may be rectified after stopping the advance of the pipeline, while the fault is in the inspection zone. Where the inspection zone has a length Dmax and the pipeline is advanced at a velocity V, the alert may be raised within a time period Tmax being V/Dmax.

Advantageously, the pipeline may be advanced continuously unless and until a fault is detected in the at least one cable applied to the pipeline.

Insulation resistance monitoring of the at least one cable may be repeated and the alert may be raised only if a fault is detected on successive monitoring operations.

Insulation resistance monitoring may be performed by a monitoring unit that is connected to a leading end of the at least one cable. Such a monitoring unit may, for example, be located within or ahead of a leading end of the pipeline.

An alert signal may be transmitted in an upstream direction from the monitoring unit to a remote alarm or control unit. Such an alarm unit is suitably positioned to convey the alert signal to a first location at which the at least one cable applied to the pipeline is accessible. The monitoring unit may be downstream of that first location, at a second location at which the at least one cable applied to the pipeline is substantially inaccessible. Conveniently, therefore, the monitoring unit may be configured remotely when the monitoring unit is at the second location.

The method of the invention may comprise: applying a set of cables to the pipeline simultaneously; and performing insulation resistance monitoring on the cables of the set while the set of cables is being applied to the pipeline. For example, insulation resistance monitoring may be performed on the cables of the set cyclically in succession through the set. At least one cycle of performing insulation resistance monitoring on all cables of the set may be performed between application of the cables to the pipeline and concealment of the cables beneath an outer pipe or other covering. Insulation resistance monitoring may, for example, be performed on one of the cables of the set against each other cable of the set.

The inventive concept also embraces a cable monitoring arrangement for monitoring at least one cable being installed along a pipeline. The arrangement comprises: an inspection zone through which the pipeline may be advanced continuously, the inspection zone extending between an upstream location at which the at least one cable is applied to the pipeline and a downstream location at which the at least one cable is concealed beneath an outer pipe or other covering; and an insulation resistance monitoring unit connected to the at least one cable and to earth, the monitoring unit being configured to monitor the at least one cable and to raise an alert on detecting a fault in the at least one cable, before the fault exits the inspection zone as the pipeline and the at least one cable advance through the downstream location.

The arrangement may further comprise an alarm unit that is remote from the monitoring unit and that is positioned to convey the alert signal to the inspection zone.

The monitoring unit suitably comprises a wired or wireless communications interface in communication with the alarm unit, and may be remotely configurable.

Conveniently, the monitoring unit is supported by the pipeline and may, for example, be disposed within a leading end portion of the pipeline.

Where a set of cables is applied to the pipeline and connected to the monitoring unit, the monitoring unit may be configured to perform insulation resistance monitoring on all of the cables of the set. For example, the monitoring unit may comprise a switching unit for performing insulation resistance monitoring cyclically in succession through the cables of the set.

In summary, the cables to be monitored are pulled off their reels at a defined speed and laid on and around an earthed pipe structure. After an opportunity for visual inspection of any crossing or wire damage in a measurement zone or free access area that is just a few metres long, further process steps block access to the cables and visual inspection is therefore no longer possible.

The objective of continuous cable monitoring in the invention is to raise an alarm and stop the fabrication process as soon as a fault situation is detected on any of the monitored cables. When the process is proceeding correctly, each cable remains insulated, above an acceptance criterion, from any other cable and from earth. If for any reason the insulation resistance of a cable deviates from this criterion, the process must be stopped as quickly as possible so that the cause of the insulation resistance fault may be assessed and repaired.

The philosophy of the invention therefore differs markedly from the philosophy of the prior art. In this respect, the prior art approach is to pause the manufacturing process repeatedly to check for faults in the cables. In contrast, the approach of the invention is to continue the manufacturing process uninterruptedly unless and until a fault in a cable is detected. In that event, the manufacturing process is stopped quickly enough that the fault can be located and rectified while the location of the fault along the cable remains easily accessible.

Advantageously, the insulation resistance measuring equipment should be relatively fast, hence performing tests quickly, and the measurement zone should be relatively short to liberate space in the manufacturing facility. The longer the measurement time and the shorter the measurement zone, the less the chance for visual inspection of a faulty point in a cable before that fault is concealed by a further manufacturing process, for example on being pushed into an outer pipe of a PiP assembly.

In the best case, any fault should be detected just after cables have been laid on the pipeline. This allows just a few metres of movement of the pipeline in which to raise an alarm and stop the process to check what has occurred before the part of the cable carrying the fault is covered to become concealed and inaccessible.

Conventional insulation resistance measurement involves a DC measurement voltage of at least 500V DC and an energisation time of at least two minutes per cable. Such high voltage requires the fabrication process to be stopped during measurement for operator safety reasons. Using very low voltage would eliminate such safety issues.

An energisation time of two minutes for each measurement corresponds to a testing cycle of at least one hour where testing is performed on thirty or more cables. This also corresponds to a fabrication speed below 10 m/hour, which may be too slow. Faster sampling is therefore needed to perform insulation resistance measurement with sufficient speed. If the sampling period is too long, the fault location may already have been obscured by further processes by the time that the alarm is finally raised.

The sampling period is the minimum time required to make an insulation resistance measurement on one cable against all other cables, or against a smaller selection or group of the other cables. If a measurement of a potentially faulty cable is to be repeated before raising the alarm, a sampling period of no more than thirty seconds would allow all cables to be checked within fifteen minutes. Longer sampling periods such as one minute or more may be possible for slower fabrication processes, or if fewer insulation resistance measurements are made on fewer cables.

Embodiments of the invention implement a method for monitoring the integrity of at least one electric cable during its installation along a pipeline, the method comprising: (a) connecting an insulation resistance monitoring device to a first end of the at least one cable; (b) laying at least a section of the cable along the pipeline while simultaneously performing insulation resistance tests; (c) raising an alarm in case of detection of a defect; and (d) repeating steps (b) and (c) until the cable is entirely laid along the pipeline.

Step (a) may comprise: inserting a capsule containing the insulation resistance monitoring device into the first end of the pipeline; connecting multiple cables to the insulation monitoring device; and/or connecting the insulation resistance monitoring device to earth.

Step (b) may comprise: unspooling the cables from a cable lay machine at a point of application of the or each cable to the pipeline; advancing the pipeline relative to the cable lay machine or the cable lay machine relative to the pipeline; and/or continuously advancing the pipeline relative to the cable lay machine. Step (b) may also comprise inserting the pipeline into an outer pipe or casing at a distance $D_{max}$ from the point of application. The maximum distance $D_{max}$ may be pre-determined by the distance at which the pipeline is inserted into an external pipeline or casing.

Step (c) may further comprise: detecting a defect in the at least one cable in a duration shorter than a maximum acceptable time $T_{max}$; and/or stopping cable installation and correcting the defect before restarting the operation. $T_{max}$ may be pre-determined by a maximum distance from the point of application of the cables, during which visually inspecting the cable remains possible. $T_{max}$ may be calculated as the velocity of motion of the pipeline divided by $D_{max}$.

Embodiments of the invention also disclose a cable monitoring arrangement for monitoring at least one cable being installed along a pipeline. The arrangement comprises: an insulation resistance monitoring module, inside a first end of the pipeline, connected to the at least one cable and to the earth. The module comprises a communication unit, whereby the module allows frequent monitoring. A remote display receives test results from the communication unit, whereby the test results are received and displayed on the remote display before the cable reaches a predetermined limit distance from its installation point.

The communication unit may operate wirelessly, hence for example comprising a Wi-Fi unit or a radio transmitter, or by a wired connection that may, for example, comprise a fibre optic emitter in data communication with a fibre optic cable laid along with the other cables. The communication unit may be able to communicate with the remote display at a distance of hundreds of metres up to, for example, 2 km, or whatever discrete, continuously-cabled length of pipeline, such as a pipe stalk, the manufacturing facility may be capable of producing.

To summarise examples of the invention used when manufacturing a pipeline that carries an array of electrical cables, insulation resistance monitoring is performed by a monitoring unit that is connected to the cables of the array and is mounted to a leading end of the pipeline. The monitoring unit tests the cables cyclically in succession.

Monitoring is performed on the cables after their application to the pipeline and while the pipeline and the cables advance together through further manufacturing processes, such as insertion of the pipeline into the outer pipe of a PiP structure. If a fault is detected in any of the cables, an alert can be raised quickly enough to stop the process and to find and rectify the fault before the fault is covered and rendered inaccessible. The pipeline and the cables can advance continuously unless a fault is detected.

To put the invention into context, reference has already been made to FIGS. 1 and 2 of the accompanying drawings, in which:

FIG. 1 is a schematic side view of a pipeline production facility as known in the prior art; and FIG. 2 corresponds to FIG. 1 but shows the facility assembling a PiP structure as also known in the prior art.

Figure 3:
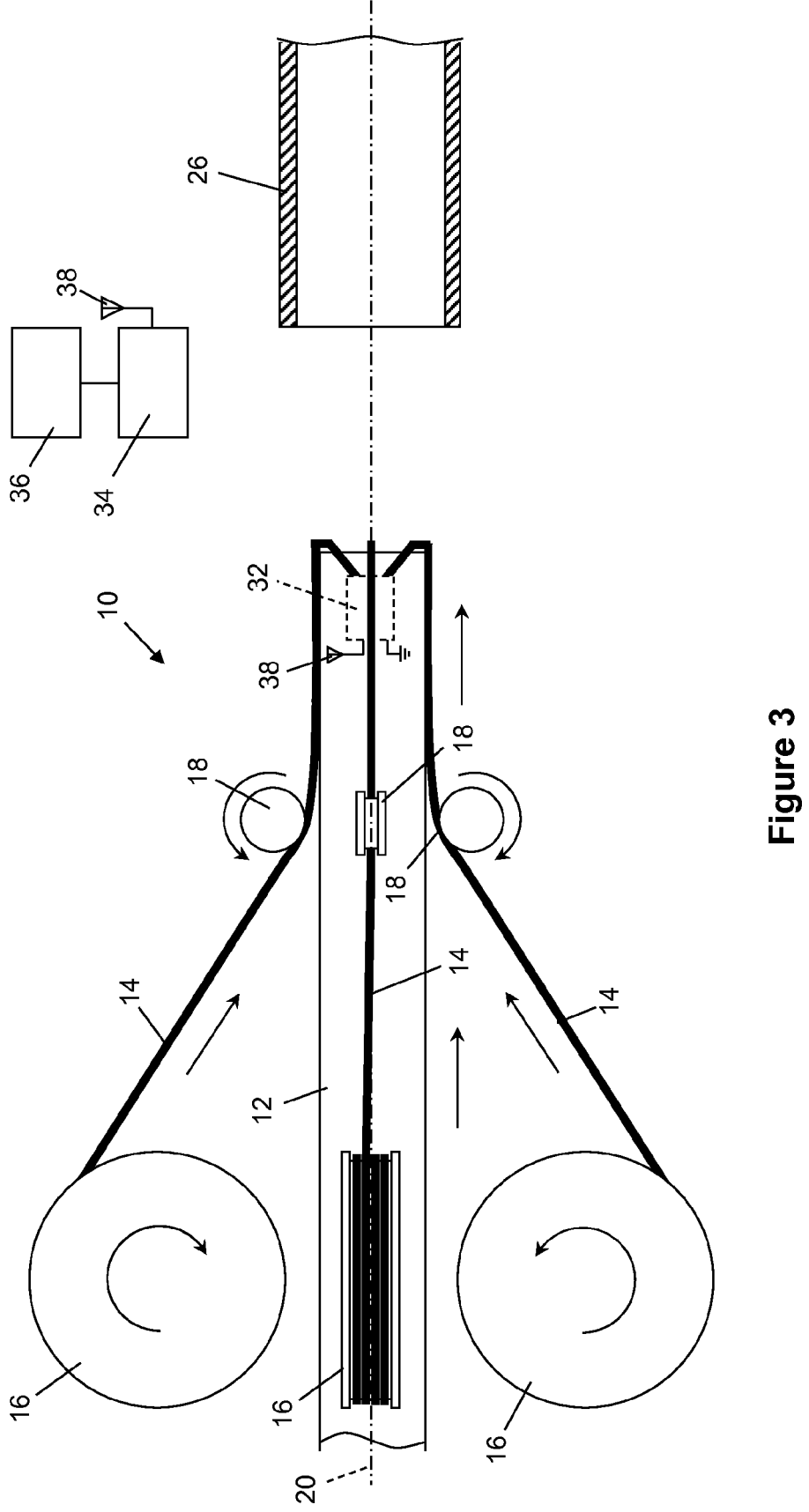
Figure 4:
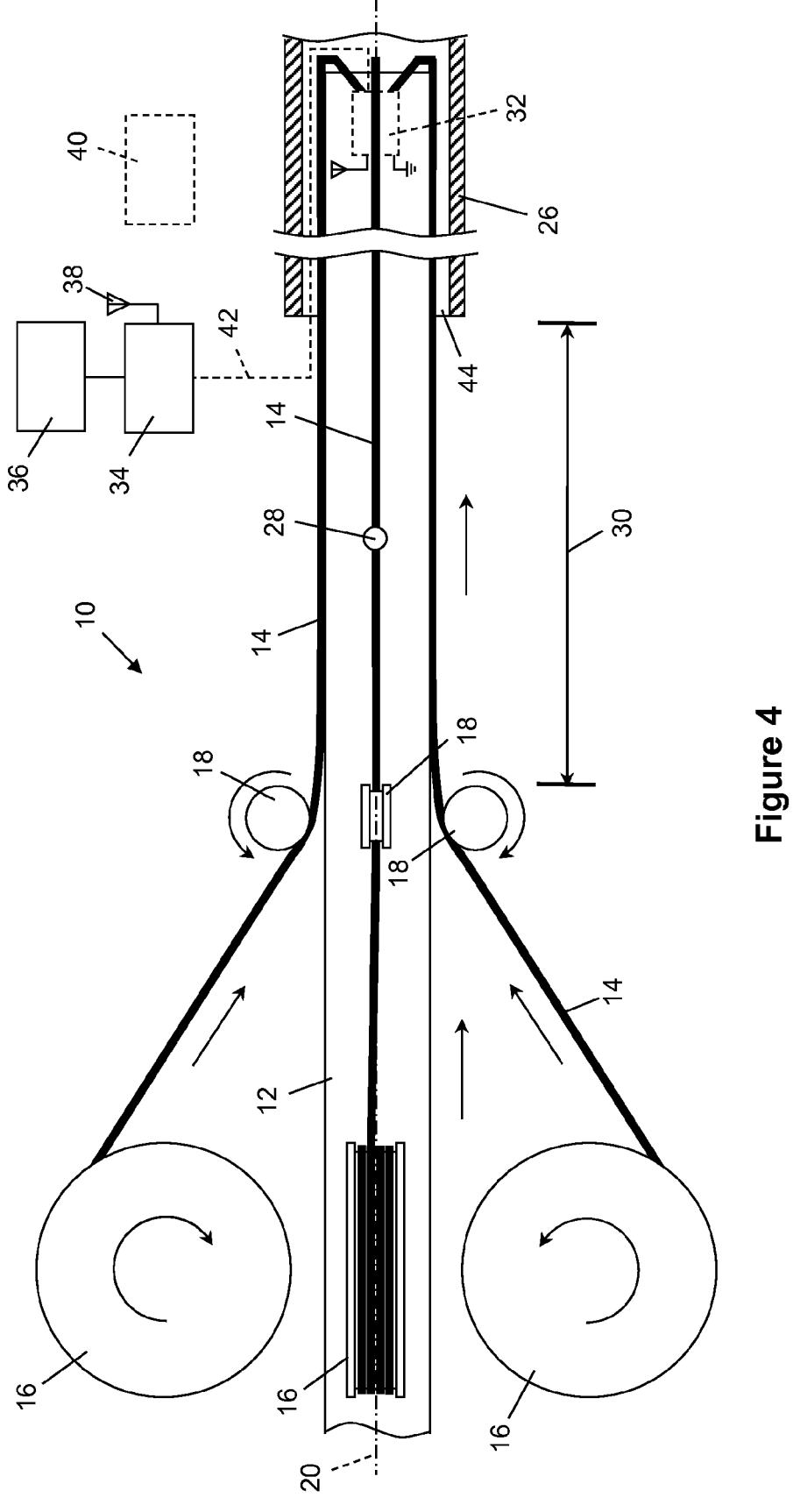
Figure 5:
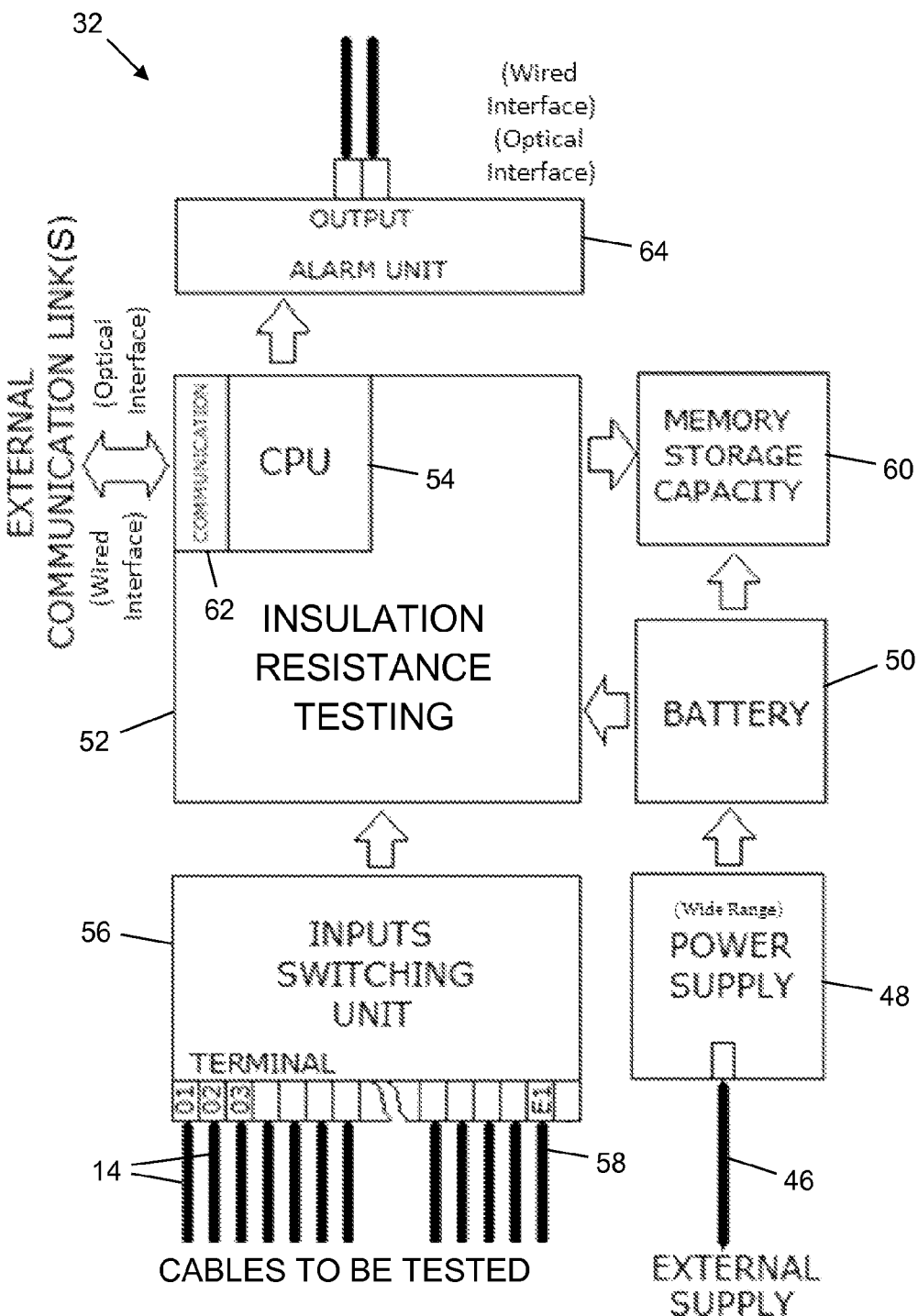

In order that the invention may be more readily understood, reference will now be made, by way of example, to the remainder of the accompanying drawings, in which:

FIG. 3 is a schematic side view of a pipeline production facility in accordance with the invention, while assembling a PiP structure like that shown in FIG. 2 in which the pipeline serves as the inner pipe of the PiP structure;

FIG. 4 corresponds to FIG. 3 but shows the pipeline now inserted telescopically into the outer pipe of the PiP structure; and FIG. 5 is a block diagram of an insulation resistance monitoring module of the invention, as depicted schematically in FIGS. 3 and 4.

To the extent that FIGS. 3 and 4 correspond to FIG. 2, like numerals are used for like features. FIGS. 3 and 4 show the invention in the context of assembling a PiP structure like that shown in FIG. 2. However, the principles of the invention can also be applied to a situation like that shown in FIG. 1, in which the cables 14 on the pipeline 12 are instead covered by some other process such as application of a coating 24, insulation blanket or spacer. In that case, it will be appreciated that a work station 22 as shown in FIG. 1 may be substituted for the outer pipe 26 of the PiP structure shown in FIGS. 3 and 4.

FIG. 3 shows a leading end of the pipeline 12 approaching the trailing end of the outer pipe 26 whereas FIG. 4 shows the leading end of the pipeline 12 received telescopically within the outer pipe 26. Both FIGS. 3 and 4 show an insulation resistance monitoring unit or module 32 connected to all of the cables 14 on the pipeline 12 and to earth. In this example, the module 32 is positioned inside the leading end of the pipeline 12, which conveniently both supports and protects the module 32. The cables 14 therefore extend around the leading end and into the central lumen of the pipeline 12 to connect to the module 32.

FIGS. 3 and 4 also show an alarm unit 34 that is responsive to the module 32 by activating a visual display and/or an audible alarm, such as a buzzer, to indicate the presence of a fault 28 in one of the cables 14 when detected by the module 32. With reference to FIG. 4, the alarm unit 34 is positioned so that workers attending to the inspection zone 30 of the pipeline 12 immediately upstream of the outer pipe 26 can react to a display or alarm and respond promptly to an alert generated by the module 32 that indicates the presence of a fault 28.

Additionally, a process controller 36 that is responsive to the module 32 either directly or via the alarm unit 34, as shown, may stop movement of the pipeline 12 and unspooling of the cables 14 from the reels 16 automatically. The process may then remain stopped until the fault 28 has been traced and rectified, whereupon the process can be restarted on command from a supervising operator.

In the example shown in FIGS. 3 and 4, the module 32 and the alarm unit 34 have respective antennae 38 for wireless communication between them. Such wireless communication could be effected directly by radio signals but optionally, as shown in FIG. 4, an intermediate communication system 40 could relay signals from the module 32 to the alarm unit 34, for example by Wi-Fi. FIG. 4 also shows the further option of a wired connection 42 between the module 32 and the alarm unit 34, extending along the annulus 44 between the pipeline 12 and the outer pipe 26. The wired connection 42 could be an optical fibre data link or other wired data connection.

FIG. 5 exemplifies the functional structure of the insulation resistance monitoring module 32. The module 32 is electrically powered from an external supply via an external power link 46, such as a power cable that may extend along the annulus 44 of a PiP structure. The power link 46 is connected to a wide-range power supply 48 that charges an internal battery 50 as a back-up in case of failure of the power link 46. The internal battery has sufficient capacity to power the module 32 during a specified autonomy period, for example of at least two weeks, at the required testing rate. The module 32 could instead be powered solely by the power link 46 or by the internal battery 50.

Insulation resistance testing is performed continuously and automatically at 52 under the control of a CPU 54, testing each cable 14 against all other cables 14, or against a limited selection of cables 14, and earth. For example, an acceptance resistance criterion of between 1 GΩ and 10 GΩ may be configured and set.

The CPU 54 receives monitoring inputs from a switching unit 56 to which the cables 14 and an earth connection 58 are connected via respective terminals. The switching unit 56 cycles rapidly through the cables 14 to perform insulation resistance tests on each cable 14 in turn. Optionally, as shown, the CPU 54 may be supported by a memory 60 that can store the results of monitoring until the end of a measurement period.

The CPU 54 controls and responds to a communications interface 62 that establishes one or more permanent and continuous external communication links, including an output 64 to the alarm unit 34. More generally, the communications interface 62 may convey events or commands from or to the module 32 in operation, such as: alarm raised, in case of measurement of a faulty cable 14; stop alarm; measurement standby; restart measurement cycles; or transmit data recorded in the memory 60.

Using a laptop connected to the module 32 or a dedicated interface embedded in the module 32, an operator may use the communications interface 62 to configure the module 32 remotely, adjusting parameters such as: sampling period; acceptance criteria; number of cable inputs connected; whether or not to repeat measurement of a possibly faulty cable 14 before raising an alarm; whether or not to store each measurement in the memory 60; and accessing and reading or downloading any data recorded in the memory 60 after the end of a measurement period for subsequent download.

In this example, the communication links are effected by a wired or optical interface although wireless transmission is also possible as explained above. Wireless transmission may be effected by a radio link as noted above or by a sonic (such as ultrasonic) link or other electromagnetic (such as infrared) link. Potentially, communications signals could be transmitted to and from the module 32 along one or more of the cables 14.

Many other variations are possible within the inventive concept. For example, the insulation resistance monitoring module 32 could be positioned outside the pipeline 12, for instance ahead of the pipeline 12 on the central longitudinal axis 20.

Whilst, in the above examples, the pipeline 12 moves past stationary cable-laying equipment comprising the reels 16 and guides 18, it would be possible instead for that cable-laying equipment to move past a stationary pipeline 12. Similarly, it would be possible for the outer pipe 26 of a PiP arrangement to be advanced over a stationary pipeline 12, or to be assembled around the pipeline 12.

The invention claimed is:

1. A method of manufacturing a pipeline having at least one cable applied thereto, the method comprising:
   performing insulation resistance monitoring on the at least one cable during application of the at least one cable to the pipeline while the at least one cable is moving relative to the pipeline; and
   raising an alert if the insulation resistance monitoring detects a fault in the at least one cable applied to the pipeline.

2. The method of claim 1, comprising stopping the relative movement between the at least one cable and the pipeline upon raising the alert.

3. The method of claim 1, comprising:
   advancing the pipeline or a cable lay apparatus while applying the at least one cable to the pipeline and performing insulation resistance monitoring on the at least one cable; and
   stopping the advancing of the pipeline or of the cable lay apparatus upon raising the alert.

4. The method of claim 3, comprising:

performing a process that covers the pipeline and the at least one cable applied to the pipeline; and stopping the advancing of the pipeline before the fault in the at least one cable is covered by said process.

5. The method of claim 4, wherein said process is either insertion of the pipeline and the at least one cable into an outer pipe or application of a covering over the pipeline and the at least one cable.

6. The method of claim 4, comprising advancing the pipeline through an inspection zone in which the at least one cable applied to the pipeline is accessible, before the pipeline and the at least one cable applied to the pipeline are covered by said process.

7. The method of claim 6, further comprising rectifying the fault after stopping the advancing of the pipeline, while the fault is in the inspection zone.

8. The method of claim 6, wherein the inspection zone has a length $D_{max}$, the pipeline is advanced at a velocity V and the alert is raised within a time period $T_{max}$ being $V/D_{max}$.

9. The method of claim 3, comprising advancing the pipeline continuously unless the fault is detected in the at least one cable applied to the pipeline.

10. The method of claim 1, comprising repeating the performing of the insulation resistance monitoring of the at least one cable and raising the alert if the fault is detected on successive monitoring operations.

11. The method of claim 1, comprising performing the insulation resistance monitoring by a monitoring unit that is connected to a leading end of the at least one cable.

12. The method of claim 11, wherein the monitoring unit is located within or ahead of a leading end of the pipeline.

13. The method of claim 11, comprising transmitting an alert signal in an upstream direction from the monitoring unit to a remote alarm or control unit.

14. The method of claim 13, wherein the alarm or control unit is positioned to convey the alert signal to a first location at which the at least one cable applied to the pipeline is accessible.

15. The method of claim 14, wherein the monitoring unit is downstream of said first location, at a second location at which the at least one cable applied to the pipeline is substantially inaccessible.

16. The method of claim 15, comprising configuring the monitoring unit remotely when the monitoring unit is at the second location.

17. The method of claim 1, comprising:

applying a set of cables to the pipeline simultaneously; and performing insulation resistance monitoring on the cables of the set while the set of cables is being applied to the pipeline.

18. The method of claim 17, comprising performing the insulation resistance monitoring on the cables of the set cyclically in succession through the set.

19. The method of claim 18, comprising completing at least one cycle of performing insulation resistance monitoring on all cables of the set, between application of the cables to the pipeline and concealment of the cables beneath an outer pipe or other covering.

20. The method of claim 17, comprising performing the insulation resistance monitoring on one of the cables of the set against each other cable of the set.

21. A cable monitoring arrangement for monitoring at least one cable being installed along a pipeline, the arrangement comprising:

an inspection zone through which the pipeline may be advanced continuously, the inspection zone extending between an upstream location at which the at least one cable is applied to the pipeline and a downstream location at which the at least one cable is concealed beneath an outer pipe or other covering; and an insulation resistance monitoring unit connected to the at least one cable and to earth, the monitoring unit being configured to monitor the at least one cable and to raise an alert on detecting a fault in the at least one cable, before the fault exits the inspection zone as the pipeline and the at least one cable advance through the downstream location.

22. The arrangement of claim 21, further comprising an alarm unit that is remote from the monitoring unit and that is positioned to convey the alert signal to the inspection zone.

23. The arrangement of claim 21, wherein the monitoring unit comprises a wired or wireless communications interface in communication with the alarm unit.

24. The arrangement of claim 21, wherein the monitoring unit is remotely configurable.

25. The arrangement of claim 21, wherein the monitoring unit is supported by the pipeline.

26. The arrangement of claim 25, wherein the monitoring unit is disposed within a leading end portion of the pipeline.

27. The arrangement of claim 21, wherein a set of cables is applied to the pipeline and connected to the monitoring unit and the monitoring unit is configured to perform insulation resistance monitoring on all the cables of the set.

28. The arrangement of claim 27, wherein the monitoring unit comprises a switching unit for performing insulation resistance monitoring cyclically in succession through the cables of the set.

* * * * *